(12) United States Patent
Ma

(10) Patent No.: US 7,737,741 B2
(45) Date of Patent: Jun. 15, 2010

(54) PERIODIC SIGNAL DELAY APPARATUS, SYSTEMS, AND METHODS

(75) Inventor: Yantao Ma, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 235 days.

(21) Appl. No.: 11/858,727

(22) Filed: Sep. 20, 2007

(65) Prior Publication Data

US 2009/0079481 A1    Mar. 26, 2009

(51) Int. Cl.
*H03L 7/06* (2006.01)
(52) U.S. Cl. .................... 327/158; 327/156; 327/149

(58) Field of Classification Search ............... 327/159, 327/147–158, 172, 174–175
See application file for complete search history.

(56) References Cited

U.S. PATENT DOCUMENTS

| | | | |
|---|---|---|---|
| 5,565,820 A | 10/1996 | Peyrotte et al. | |
| 5,949,296 A | 9/1999 | Jacobson | |
| 6,603,340 B2 * | 8/2003 | Tachimori | 327/262 |
| 6,819,190 B2 * | 11/2004 | Pearce et al. | 331/57 |

* cited by examiner

*Primary Examiner*—Dinh T. Le
(74) *Attorney, Agent, or Firm*—Schwegman, Lundberg & Woessner, P.A.

(57) ABSTRACT

Apparatus, systems, and methods are disclosed that operate to delay a periodic input signal in one or more delay elements of a group of delay elements to generate a periodic output signal and to vary a power supply to the delay elements. Additional apparatus, systems, and methods are disclosed.

27 Claims, 10 Drawing Sheets

PERIODIC SIGNAL DELAY APPARATUS, SYSTEMS, AND METHODS

BACKGROUND

Delay lock loop (DLL) circuits are used to generate a periodic signal such as a clock signal based on a periodic reference signal from, for example, an oscillator. The generated clock signal should maintain a specific phase relationship with the reference signal to be synchronized. A DLL circuit will adjust the phase of the generated clock signal to maintain the desired phase relationship. DLL circuits are used, for example, in high-speed clocked memories such as synchronous dynamic random access memory (SDRAM) devices.

DETAILED DESCRIPTION

DLLs may in future be required to lock clock signals with increasing periods. The inventor has discovered that DLLs may not be able to lock on clock signals with longer periods. A long clock signal period may require all of the delay elements of a DLL to be active. In this case, the DLL is not in lock. In addition, in accommodating for the longer period of the clock signal the DLL may not be able to keep an output signal within specified parameters.

According to embodiments of the invention described herein, a periodic input signal is delayed in one or more delay elements of a group of delay elements to generate a periodic output signal and a power supply to the delay elements is varied. The periodic input signal may be a clock signal, and the embodiments are useful to aid the delay elements in managing an input clock signal over a wide clock frequency range between a minimum clock signal period (tCKmin) and a maximum clock signal period (tCKmax). According to embodiments of the invention described herein, a delay imparted by one or more of the delay elements to the periodic input signal is modulated while the periodic input signal is being delayed.

Figure 1:
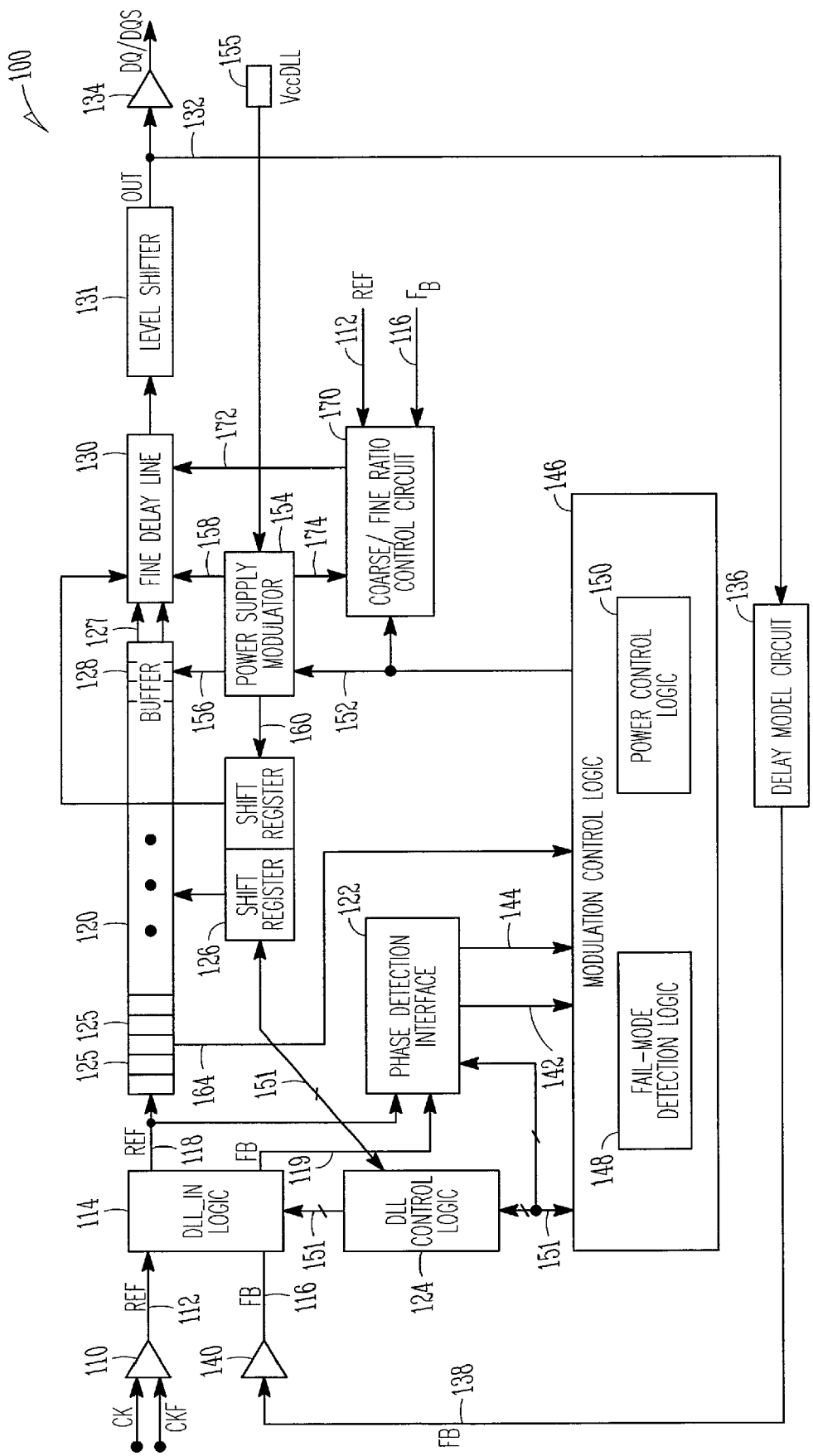
FIG. 1 is a block diagram of a DLL according to an embodiment of the invention.

FIG. 1 is a block diagram of a DLL 100 according to an embodiment of the invention. An input buffer 110 is coupled to receive a periodic signal CK and an inverse periodic signal CKF. The signals CK and CKF are received from a source external to the DLL 100, and may be generated by an oscillator. The input buffer 110 generates a periodic reference signal REF on a line 112 that is coupled to an interface control circuit 114. The interface control circuit 114 is also coupled to receive a feedback signal FB on a line 116, and generation of the feedback signal FB will be discussed below.

The interface control circuit 114 couples the reference signal REF on a line 118 to a coarse variable delay line 120, and couples the feedback signal FB on a line 119 and the reference signal REF on the line 118 to a phase detection interface circuit 122. In some embodiments, the signals on the lines 118, 119 are clock signals. A control logic circuit 124 generates a control signal to disable or shut off various circuits as will be described below.

The coarse variable delay line 120 includes a series connection of a plurality of delay elements 125 that impart a delay to the reference signal REF according to instructions from a pair of shift registers 126 coupled to the coarse variable delay line 120. The shift registers 126 contain binary bits used to select one delay element 125 as an entry point for the reference signal REF into the coarse variable delay line 120, and the entry point determines the number of the delay elements 125 that operate on the reference signal REF as it is coupled through the coarse variable delay line 120. The coarse variable delay line 120 generates a delayed reference signal on a pair of lines 127. A selected number of the delay elements 125 in the coarse variable delay line 120 are included in a buffer 128, and these delay elements 125 impart delays to the reference signal REF during an initialization of the DLL 100.

The delayed reference signal on the lines 127 is coupled to a fine variable delay line 130 that includes delay elements to impart a further delay to the reference signal REF based on instructions from the shift registers 126. The fine variable delay line 130 generates an output signal OUT that is further delayed from the reference signal REF according to the instructions from the shift registers 126. The binary bits in the shift registers 126 are used to select an entry point for the delayed reference signal in the fine variable delay line 130, or an exit point. Each delay element 125 in the coarse variable delay line 120 imparts a greater delay to the reference signal REF when compared to the delay imparted by each delay element in the fine variable delay line 130. The output signal OUT from the fine variable delay line 130 is coupled to a level shifter circuit 131. The level shifter circuit 131 couples the output signal OUT to a line 132.

An output buffer 134 couples the output signal OUT to output ports or pins DQ and DQS (not shown). The output signal OUT on the line 132 is also coupled through delay model circuit 136 that mimics a timing delay external to the DLL 100 in order to generate the feedback signal FB on a line 138. The feedback signal FB on the line 138 is further coupled through a replica buffer 140 that is a replica of the input buffer 110 to impart a delay to the feedback signal FB similar to the delay imparted by the input buffer 110. The replica buffer 140 generates the feedback signal FB on the line 116.

The phase detection interface circuit 122 detects a phase difference between the reference signal REF and the feedback signal FB on the lines 118 and 119, respectively. Information about the phase difference in a phase difference signal is coupled through two lines 142 and 144 to a modulation control logic circuit 146. The modulation control logic circuit 146 includes a fail-mode detection logic circuit 148 and a power control logic circuit 150, both of which will be further described herein. When the DLL 100 is in lock, there is approximately zero phase difference between reference signal REF and the feedback signal FB on the lines 118 and 119, respectively.

The control logic circuit 124 drives logic timing control signals and shift logic control signals on to a bidirectional bus 151 to the interface control circuit 114, the modulation control logic circuit 146, the phase detection interface circuit 122, and the shift registers 126. The signals on the bidirectional bus 151 enable or disable these circuits and may change the contents of the shift registers 126. Other signals carrying out other functions are exchanged over the bidirectional bus 151 that will not be further described herein.

The power control logic circuit 150 generates a control signal on a line 152 that is coupled to a power supply modulator circuit 154 to modulate power supplied to the delay elements in the coarse variable delay line 120 and the fine variable delay line 130. The power originates from a global supply voltage VccDLL coupled to the power supply modulator circuit 154 from a pin 155 external to a device including the DLL 100. The power supply modulator circuit 154 in turn generates a supply voltage Vccdllm on a line 156 coupled to the delay elements in the coarse variable delay line 120, and on a line 158 to the delay elements in the fine variable delay line 130. The shift registers 126 also receive information about the power supplied to the delay elements in a signal from the power supply modulator circuit 154 on a line 160.

A line 164 couples a signal from a location on the coarse variable delay line 120 to the modulation control logic circuit 146 and the fail-mode detection logic circuit 148 to indicate when delay elements 125 beyond the location of the line 164 are delaying the reference signal REF. If delay elements 125 beyond the location of the line 164 are delaying the reference signal REF, then the DLL 100 is not in lock as there is not enough of a margin of unused delay elements 125 in the coarse variable delay line 120. The DLL 100 is in lock only when there is a sufficient margin of unused delay elements 125 in the coarse variable delay line 120. For example, the DLL 100 is not in lock if only two or three or five of the delay elements 125 are not imparting a delay to the reference signal REF according to embodiments of the invention. The location of the line 164 is selected according to a design margin based on acceptable noise in the DLL 100.

A coarse/fine ratio control circuit 170 generates a control signal on a line 172 coupled to the fine variable delay line 130 to change the ratio of a delay caused by a delay element 125 in the coarse variable delay line 120 to a delay caused by a delay element in the fine variable delay line 130. The coarse/fine ratio control circuit 170 receives information about the power supplied to both delay lines 120 and 130 from the power control logic circuit 150 on the line 152 and from the power supply modulator circuit 154 on a line 174. The coarse/fine ratio control circuit 170 will be further described hereinbelow.

In some embodiments, the modulation control logic circuit 146 and the coarse/fine ratio control circuit 170 are included in one or more digital signal processor (DSP) circuits.

Figures 2, 3:
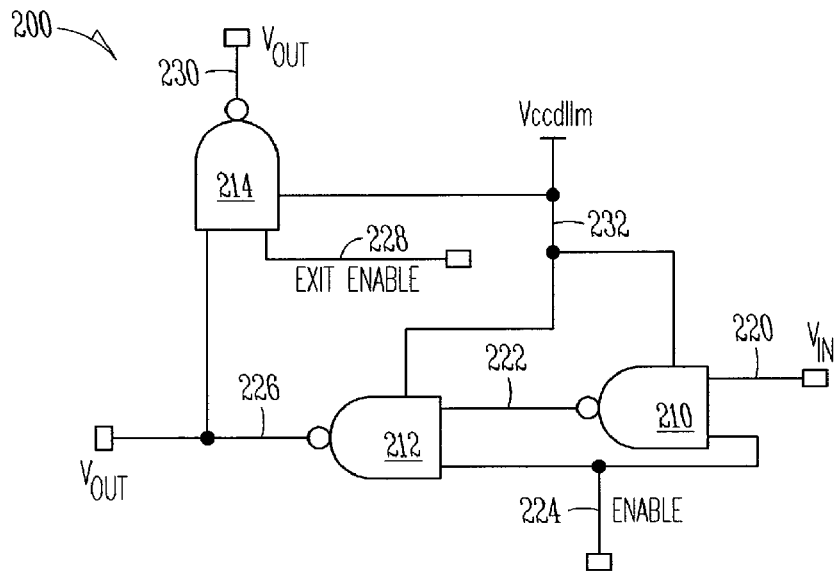
FIG. 2 is an electrical schematic diagram of a delay element according to an embodiment of the invention.
FIG. 3 is an electrical schematic diagram of a delay element according to an embodiment of the invention.

FIG. 2 is an electrical schematic diagram of a delay element 200 according to an embodiment of the invention. The delay element 200 is a digital delay element and includes a first NAND gate 210, a second NAND gate 212, and a third NAND gate 214. The first NAND gate 210 includes a first input coupled to receive an input signal Vin on a line 220 and an output coupled on a line 222 to a first input of the second NAND gate 212. A second input of the first NAND gate 210 is coupled to receive an enable signal on a line 224 as is a second input of the second NAND gate 212. The enable signal on the line 224 enables the first NAND gate 210 and the second NAND gate 212 to pass the input signal Vin to an output line 226 as an output signal Vout. The line 226 couples the output signal Vout to a first input of the third NAND gate 214, and a second input of the third NAND gate 214 is coupled to a line 228 to receive an exit enable signal. If the exit enable signal on the line 228 enables the second NAND gate 214, it passes the output signal Vout on the line 226 to a line 230.

The delay element 200 is enabled by a high logic enable signal on the line 224 coupled to the second inputs of the first NAND gate 210 and the second NAND 212 to enable them to pass the input signal Vin on the line 220 to the lines 222 and 226. The first NAND gate 210 and the second NAND gate 212 are disabled if the enable signal on the line 224 is a logic low. The output signal Vout on the line 226 is coupled to a following delay element in a delay line unless the third NAND gate 214 is enabled by a high logic exit enable signal on the line 228, in which case the output signal Vout is coupled from the line 226 through the third NAND gate 214 to the line 230. The third NAND gate 214 is an exit for the signal in the delay element 200, and if enabled it allows the output signal Vout on line 226 to exit a delay line including the delay element 200. Each of the NAND gates 210, 212 and 214 in the delay element 200 receive a supply voltage Vccdllm on a line 232. Modulation of the supply voltage Vccdllm will modulate a delay caused by the delay element 200 between the input signal Vin on line 220 and the output signal Vout on the line 226 or the line 230.

An electrical schematic diagram of a delay element 300 is shown in FIG. 3 according to an embodiment of the invention. Two p-channel transistors 302 and 304 are coupled in parallel, with sources of the p-channel transistors 302 and 304 being coupled together to receive the supply voltage Vccdllm. Drains of the p-channel transistors 302 and 304 are coupled to a gate of the p-channel transistor 302 by a line 308. Similarly, two p-channel transistors 310 and 312 are coupled in parallel with sources of the p-channel transistors 310 and 312 being coupled to the supply voltage Vccdllm. Drains of the p-channel transistors 310 and 312 are coupled to a gate of the p-channel transistor 312 by a line 316.

The drains of the p-channel transistors 302 and 304 are coupled to a line 306 and to a drain of a first n-channel transistor 330. The drains of the p-channel transistors 310 and 312 are coupled to a line 314 and to a drain of a second n-channel transistor 332. Sources of the n-channel transistors 330 and 332 are coupled together to a drain of a third n-channel transistor 334, and a source of the third n-channel transistor 334 is coupled to a ground voltage reference Vss.

The delay element 300 is an analog delay element and operates in the following manner. The p-channel transistors 302, 304, 310 and 312 are a current source to the n-channel transistors 330 and 332. A bias voltage Vbp is coupled to gates of the p-channel transistors 304 and 310 to switch them on. The p-channel transistors 302 and 312 are switched on because their gates are connected to their respective drains by the lines 308 and 316. A differential input signal Vin is coupled to differential lines 340 and 342 coupled respectively to the gates of the n-channel transistors 330 and 332, and a differential output signal Vout is generated at the lines 306 and 314 coupled respectively to the drains of the n-channel transistors 330 and 332. A bias voltage Vbn is coupled to a gate of the third n-channel transistor 334 to switch it on to control current through the n-channel transistors 330 and 332 such that the n-channel transistors 330 and 332 operate in the triode region with current from the p-channel transistors 302, 304, 310 and 312. The output signal Vout on the lines 306 and 314 is thereby controlled by the bias voltage Vbp, which is in turn controlled by a control circuit 400 shown in FIG. 4.

Figure 4:
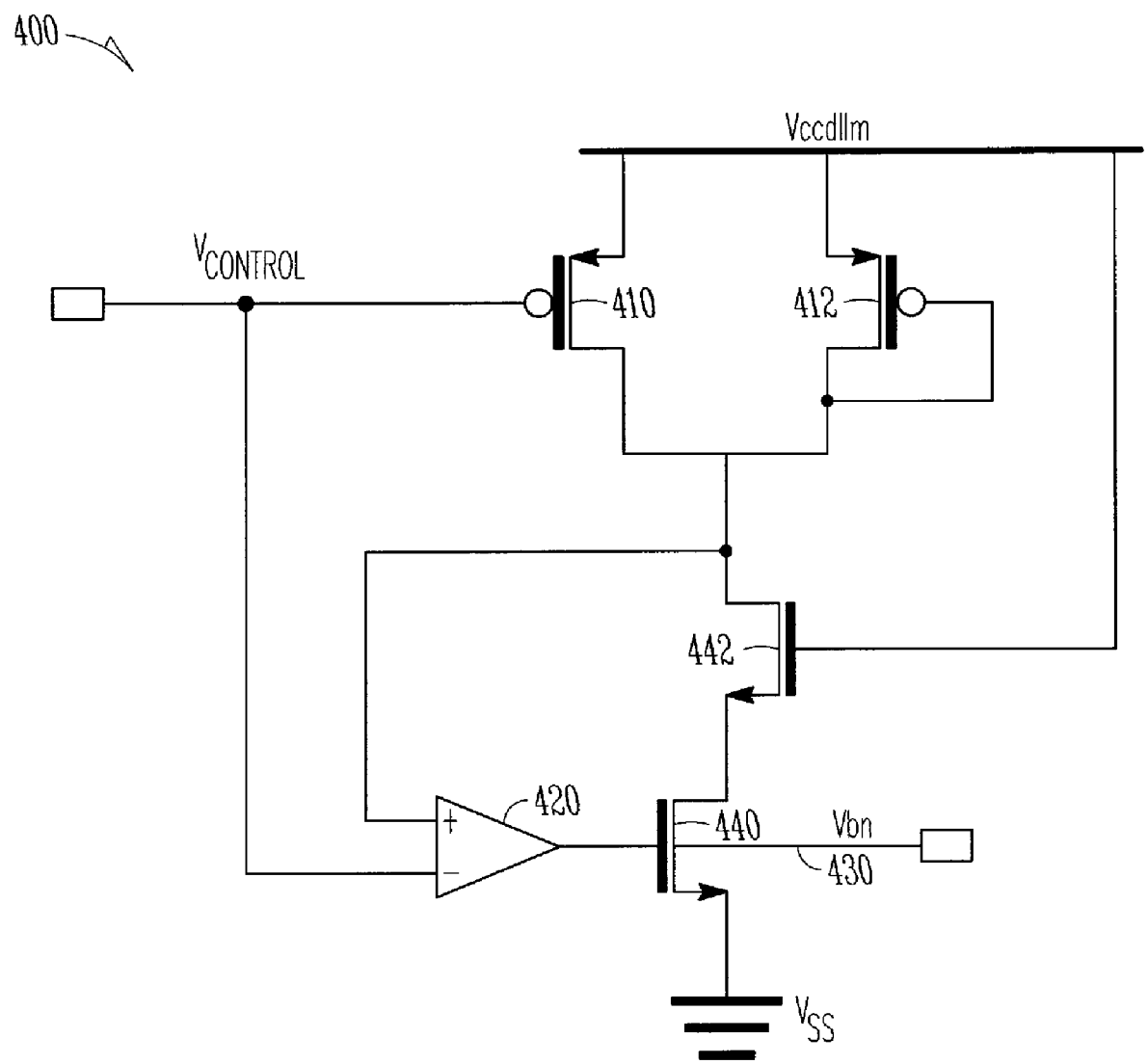
FIG. 4 is an electrical schematic diagram of a circuit associated with the delay element of FIG. 3 according to an embodiment of the invention.

An electrical schematic diagram of the control circuit 400 associated with the delay element 300 of FIG. 3 is shown in FIG. 4 according to an embodiment of the invention. The control circuit 400 includes p-channel transistors 410 and 412 coupled in parallel with sources of the p-channel transistors 410 and 412 being coupled to the supply voltage Vccdllm, and drains of the p-channel transistors 410 and 412 being coupled to a gate of the p-channel transistor 412 such that the p-channel transistor 412 is switched on. A control voltage Vcontrol is coupled to a gate of the p-channel transistor 410 and to an inverting input of an operational amplifier 420. Drains of the p-channel transistors 410 and 412 are coupled together to a non-inverting input of the operational amplifier 420. An output of the operational amplifier 420 is coupled to generate an output signal on a line 430 that is coupled to a gate of an n-channel transistor 440. A drain of the n-channel transistor 440 is coupled to a source of an n-channel transistor 442 and a drain of the n-channel transistor 442 is coupled to the drains of the p-channel transistors 410 and 412, the gate of the p-channel transistor 412, and to the non-inverting input of the operational amplifier 420. A gate of the n-channel transistor 442 is coupled to receive the supply voltage Vccdllm, and a source of the n-channel transistor 440 is coupled to a ground voltage reference Vss. The control circuit 400 amplifies the control voltage Vcontrol coupled to the inverting input of the operational amplifier 420 to generate an amplified voltage at the output of the operational amplifier 420 on the line 430 to generate the bias voltage Vbn that is coupled to the gate of the third n-channel transistor 334 in the delay element 300. Amplification is often useful because the control circuit 400 couples the bias voltage Vbn on the line 430 to multiple delay elements such as the delay element 300 shown in FIG. 3.

Referring back to the delay element 300 shown in FIG. 3, it can be seen that a modulation of the supply voltage Vccdllm modulates the delay between the differential input signal Vin on the lines 340 and 342 and the differential output signal Vout on the lines 306 and 314.

In some embodiments, the delay elements in the coarse variable delay line 120 and the fine variable delay line 130 are similar to or identical to the delay element 200 shown in FIG. 2 or the delay element 300 shown in FIG. 3. In some embodiments, power supplied to the delay element 200 shown in FIG. 2 or the delay element 300 shown in FIG. 3 may be modulated by modulating a supply current coupled to the respective delay element rather than the supply voltage Vccdllm.

Figure 5:
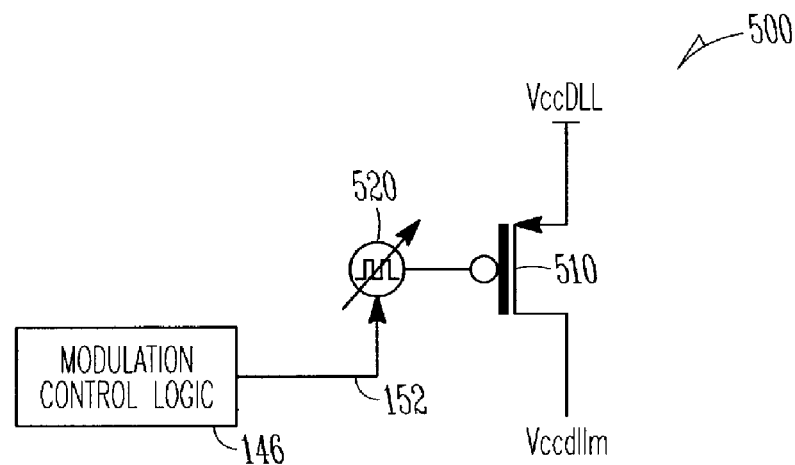
FIG. 5 is an electrical schematic diagram of a modulated voltage control circuit according to an embodiment of the invention.

FIG. 5 is an electrical schematic diagram of a modulated voltage control circuit 500 according to an embodiment of the invention. The circuit 500 includes a p-channel transistor 510 having a source coupled to the global supply voltage VccDLL for the DLL 100. The transistor 510 generates a modulated supply voltage Vccdllm on a source and receives a pulse width modulated signal 520 on a gate from the modulation control logic circuit 146 and the line 152 shown in FIG. 1. The pulse width modulated signal 520 pulses the transistor 510 on and off to generate the modulated supply voltage Vccdllm from the global supply voltage VccDLL. The transistor 510 is part of the power supply modulator circuit 154 shown in FIG. 1. The modulated supply voltage Vccdllm is coupled to the delay elements in the coarse variable delay line 120 and the fine variable delay line 130.

Figure 6:
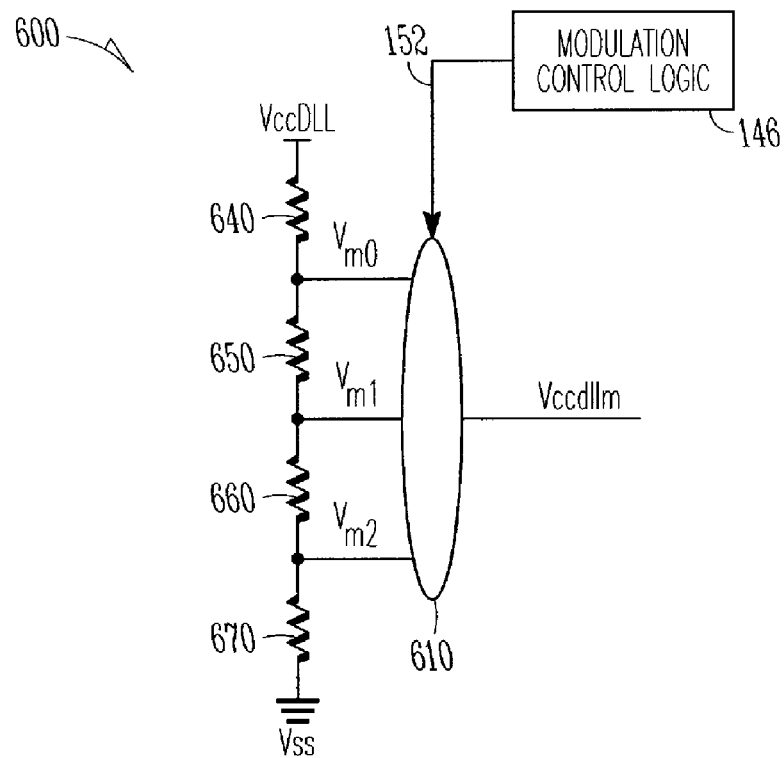
FIG. 6 is an electrical schematic diagram of a modulated voltage control circuit according to an embodiment of the invention.

FIG. 6 is an electrical schematic diagram of a modulated voltage control circuit 600 according to an embodiment of the invention. The circuit 600 includes a switch 610 coupled to select one of three modulated voltages Vm0, Vm1, and Vm2 to be a modulated supply voltage Vccdllm. The switch 610 is controlled by a control signal from the modulation control logic circuit 146 on the line 152 shown in FIG. 1. The modulated voltages Vm0, Vm1, and Vm2 are generated from a voltage divider including three resistors 640, 650, and 660 coupled in series between the global supply voltage VccDLL for the DLL 100 and the switch 610. The global supply voltage VccDLL supplies the power for the modulated voltages Vm0, Vm1, and Vm2. A fourth resistor 670 divides the modulated voltages Vm0, Vm1, and Vm2 from a ground voltage reference Vss. The circuit 600 is part of the power supply modulator circuit 154 shown in FIG. 1. The modulated supply voltage Vccdllm is coupled to the delay elements in the coarse variable delay line 120 and the fine variable delay line 130.

Figure 7:
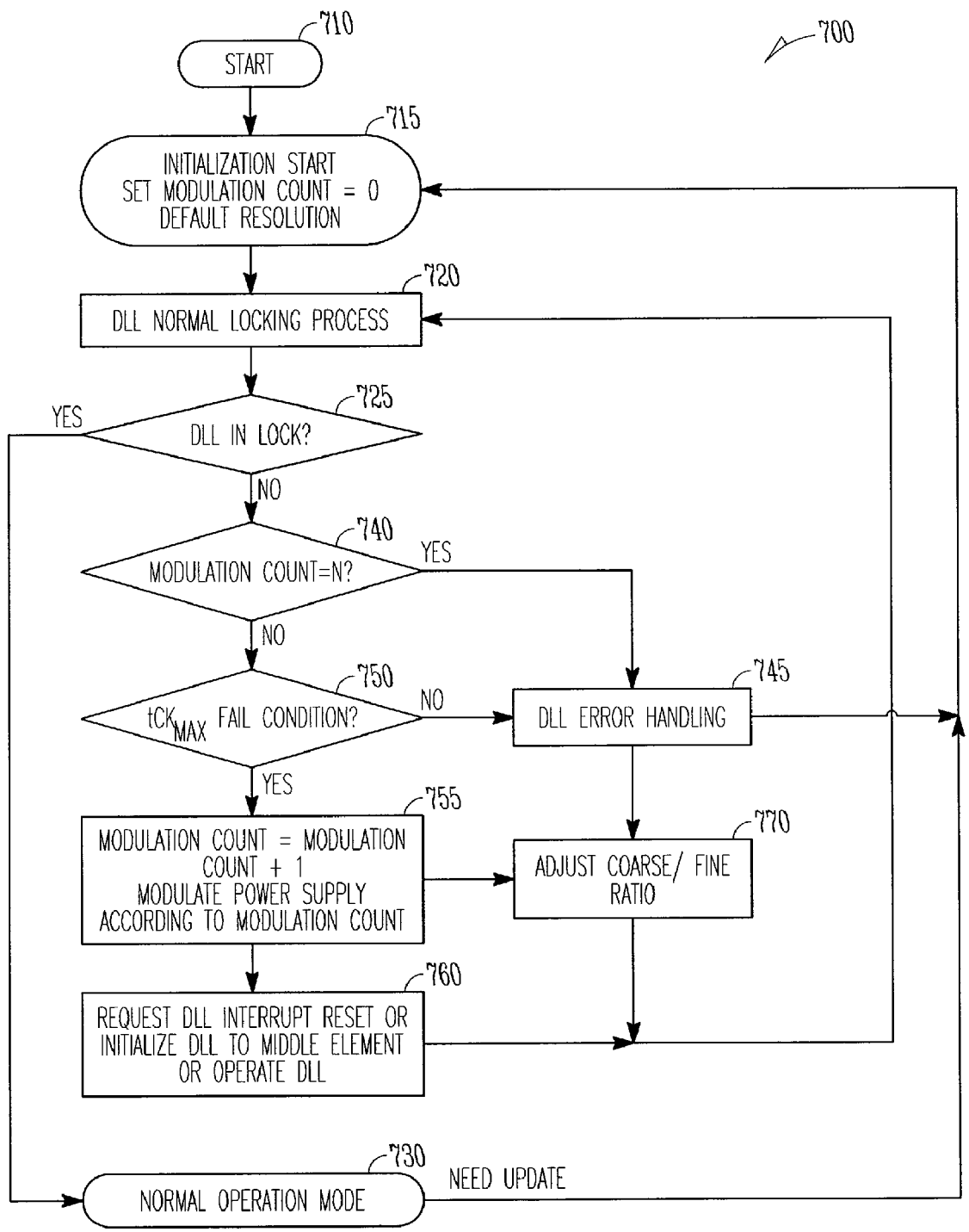
FIG. 7 is a flow diagram of several methods associated with the operation of the DLL in FIG. 1 according to an embodiment of the invention.

FIG. 7 is a flow diagram of several methods 700 associated with the operation of the DLL 100 in FIG. 1 according to embodiments of the invention.

The methods 700 start in block 710. In block 715, the DLL 100 is initialized by setting a modulation count to zero, and setting a default resolution. The resolution is a delay imparted by one fine delay element in the fine variable delay line 130. The methods 700 proceed to block 720 where the DLL 100 operates according to a normal locking process. In block 725, the methods 700 determine if the DLL 100 is in lock. The DLL 100 is in lock when there is a sufficient margin of unused delay elements in the coarse variable delay line 120. If the DLL 100 is in lock, the methods 700 proceed to block 730 where the DLL 100 is operated according to a normal operation mode. At predetermined intervals, the methods 700 return to block 715 from the block 730 to initialize the DLL 100. The predetermined intervals are set by a clock or counter that reaches a selected number of clock cycles.

If the methods 700 determine in block 725 that the DLL 100 is not in lock, then in block 740 the methods 700 determine if the modulation count is equal to N. N is a predetermined number of attempts to modulate a power supply coupled to the DLL 100. The modulation count is set to zero in block 715, and if the power supply has been modulated N times after reset, the methods 700 proceed to block 745 where DLL 100 error handling procedures begin. The error handling procedures address problems not addressed by the methods 700 to put the DLL 100 in a condition to be able to lock, and will not be further described herein. Once the error handling procedures in block 745 are complete, the methods 700 return to block 715 to initialize the DLL 100.

If the methods 700 determine in block 740 that the modulation count is less than N, the methods 700 determine in block 750 whether the DLL 100 is in a fail condition caused by the periodic signal CK (shown in FIG. 1) having a period $tCK_{max}$ that does not allow the DLL 100 to lock. If the methods 700 determine in block 750 that the failure of the DLL 100 to lock is not due to the period $tCK_{max}$, then the methods 700 proceed to the error handling procedures in block 745. If the methods 700 determine in block 750 that the failure of the DLL 100 to lock is due to the period $tCK_{max}$, the methods 700 proceed to block 755 where the modulation count is increased by one and the power supply coupled to the coarse variable delay line 120 and the fine variable delay line 130 is modulated according to the modulation count. More specifically, the supply voltage Vccdllm coupled to the delay elements is reduced by an amount selected to result in a predictable increase in the delay imparted by the delay elements, and this may be based on the number and magnitude of past modulations of the power supply.

Once the power supply to the DLL 100 is modulated in block 755, the methods 700 proceed to two tasks. In block 760, the methods 700 select one of three ways to move the DLL 100 to a locking state. The methods 700 request an interrupt reset, or initialize the DLL 100 to a middle element, or allow the DLL 100 to operate on its own to reach a new equilibrium with respect to the new power supply. The selection made in block 760 is based on factors such as the magnitude of the modulation of the power supply and the modulation count N. Once the power supply to the delay lines 120 and 130 is modulated in block 755, the methods 700 also proceed to block 770 where a ratio of a delay caused by each delay element in the coarse variable delay line 120 is adjusted with respect to a delay caused by each delay element in the fine variable delay line 130. The events in block 770 are informed when the error handling procedures in block 745 are taking place, and may be suspended during this time. The events in block 770 will be further described hereinbelow. At the conclusion of the events in blocks 760 and 770, the methods 700 return to the normal locking process in block 720 and the methods 700 return to block 725 to determine if the DLL 100 is in lock while receiving the modulated power supply that was modulated in block 755. If the DLL 100 is not in lock with the modulated power supply, the methods 700 return to block 740 to 770 to either modulate the power supply again, or, if the modulation count has reached N, to proceed to the error handling procedures in block 745.

Figure 8:
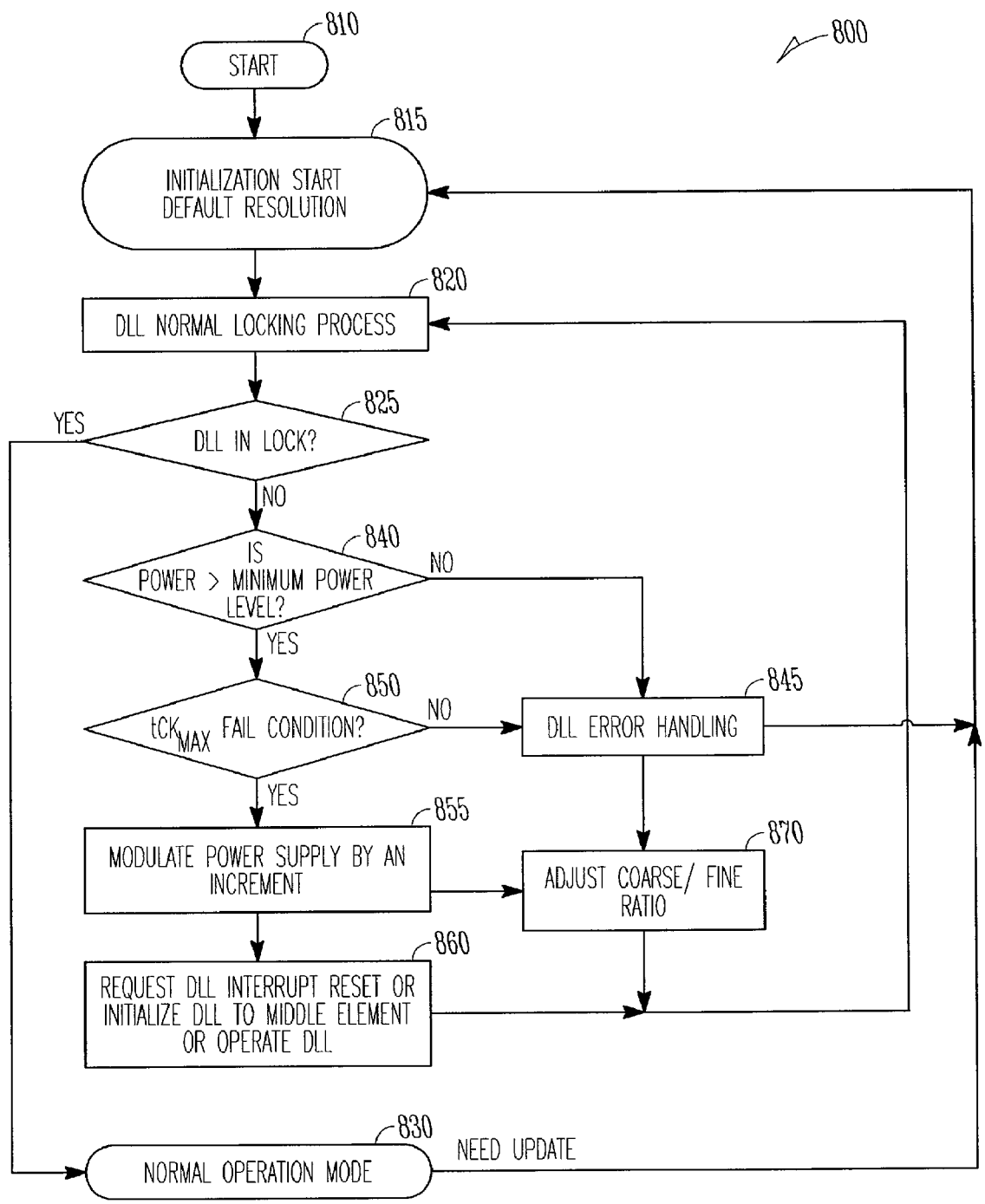
FIG. 8 is a flow diagram of several methods associated with the operation of the DLL in FIG. 1 according to an embodiment of the invention.

FIG. 8 is a flow diagram of several methods 800 associated with the operation of the DLL 100 in FIG. 1 according to embodiments of the invention. The methods 800 provide for more modulations of the power supply than the methods 700 shown in FIG. 7, and result in improved chances for putting the DLL 100 in a locking state.

The methods 800 start in block 810. In block 815, the DLL 100 is initialized by setting a default resolution. The methods 800 proceed to block 820 where the DLL 100 operates according to a normal locking process. In block 825, the methods 800 determine if the DLL 100 is in lock. If the DLL 100 is in lock, the methods 800 proceed to block 830 where the DLL 100 is operated according to a normal operation mode. At predetermined intervals, the methods 800 return to block 815 from the block 830 to initialize the DLL 100. The predetermined intervals are set by a clock or counter that reaches a selected number of clock cycles.

If the methods 800 determine in block 825 that the DLL 100 is not in lock, then in block 840 the methods 800 determine if the power supply coupled to the DLL 100 is greater than a minimum power level. The minimum power level is determined by the capabilities of the circuits supplying power to the DLL 100. If the power supply to the DLL 100 is not greater than the minimum power level, the methods 800 proceed to block 845 where DLL 100 error handling procedures begin. The error handling procedures address problems not addressed by the methods 800 to put the DLL 100 in a condition to be able to lock, and will not be further described herein. Once the error handling procedures in block 845 are complete, the methods 800 return to block 815 to initialize the DLL 100.

If the methods 800 determine in block 840 that the power supply to the DLL 100 is greater than the minimum power level, the methods 800 determine in block 850 whether the DLL 100 is in a fail condition caused by the periodic signal CK (shown in FIG. 1) having a period $tCK_{max}$ that does not allow the DLL 100 to lock. If the methods 800 determine in block 850 that the failure of the DLL 100 to lock is not due to the period $tCK_{max}$, then the methods 800 proceed to the error handling procedures in block 845. If the methods 800 determine in block 850 that the failure of the DLL 100 to lock is due to the period $tCK_{max}$, the methods 800 proceed to block 855 where the power supply coupled to the coarse variable delay line 120 and the fine variable delay line 130 is modulated by a predetermined increment. The increment may be selected based on the number of past modulations and the predicted increase in the imparted delay due to the modulation. According to embodiments of the invention, as the supply voltage Vccdllm gets lower the effect of reducing it becomes greater, and the supply voltage Vccdllm is reduced by smaller and smaller increments because the resulting imparted delay increases after each modulation. The power supply may be modulated in block 855 as many times as desired until the DLL 100 is in lock or the power supply is no longer greater than the minimum power level.

Once the power supply to the DLL 100 is modulated in block 855, the methods 800 proceed to two tasks. In block 860, the methods 800 select one of three ways to move the DLL 100 to a locking state. The methods 800 request an interrupt reset, or initialize the DLL 100 to a middle element, or allow the DLL 100 to operate on its own to reach a new equilibrium with respect to the new power supply. The selection made in block 860 is based on factors such as the magnitude of the modulation of the power supply and the number of past modulations. Once the power supply to the delay lines 120 and 130 is modulated in block 855, the methods 800 also proceed to block 870 where a ratio of a delay caused by each delay element in the coarse variable delay line 120 is adjusted with respect to a delay caused by each delay element in the fine variable delay line 130. The events in block 870 are informed when the error handling procedures in block 845 are taking place, and may be suspended during this time. The events in block 870 will be further described hereinbelow. At the conclusion of the events in blocks 860 and 870, the methods 800 return to the normal locking process in block 820 and then to block 825 to determine if the DLL 100 is in lock while receiving the modulated power supply that was modulated in block 855. If the DLL 100 is not in lock with the modulated power supply, the methods 800 return to block 840 to 870 to either modulate the power supply again, or, if the power supply is no longer greater than the minimum power level, to proceed to the error handling procedures in block 845.

Figure 9:
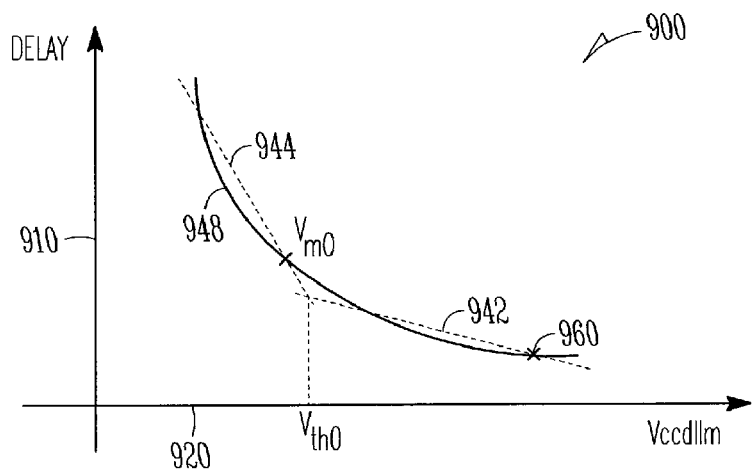
FIG. 9 is a plot of a simulation of a delay imparted to a reference signal by a DLL in response to power supplied to delay elements in the DLL according to an embodiment of the invention.

FIG. 9 is a plot 900 of a simulation of a delay imparted to the reference signal REF by the DLL 100 in response to the power supplied to the delay elements in the DLL 100 according to an embodiment of the invention. A delay imparted by the combination of the coarse variable delay line 120 and the fine variable delay line 130 is indicated on a vertical axis 910. A voltage Vccdllm coupled to the delay elements in the coarse variable delay line 120 and the fine variable delay line 130 is indicated on a horizontal axis 920. A first threshold voltage Vth0 indicates a threshold voltage border between two regions in the plot 900. Where Vccdllm is higher than Vth0, a decrease in Vccdllm will result in a relatively small increase in the delay imparted to the reference signal REF according to the lower slope of a dashed line 942. Where Vccdllm is lower than Vth0, a decrease in Vccdllm will result in a relatively large increase in the delay imparted to the reference signal REF according to the higher slope of a dashed line 944. The solid line 948 indicates a simulation of the predicted delay imparted to the reference signal REF in response to changes in Vccdllm. A location 960 indicates where the DLL 100 operates without any modulation. A voltage Vm0 indicates where the DLL 100 operates after a single modulation of Vccdllm, the delay increasing as Vccdllm decreases. The DLL 100 may not lock after the single modulation at Vm0, and the effect of two modulations of Vccdllm are shown in FIG. 10.

Figure 10:
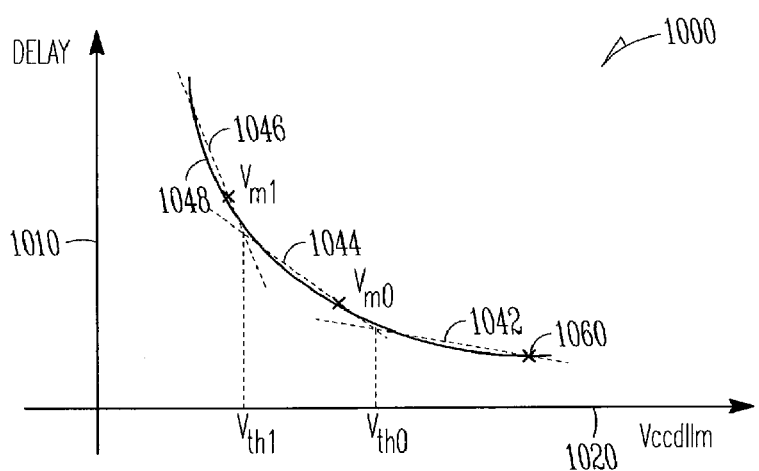
FIG. 10 is a plot of a simulation of a delay imparted to a reference signal by a DLL in response to power supplied to delay elements in the DLL according to an embodiment of the invention.

FIG. 10 is a plot 1000 of a simulation of a delay imparted to the reference signal REF by the DLL 100 in response to the power supplied to the delay elements in the DLL 100 according to an embodiment of the invention. A delay imparted by the combination of the coarse variable delay line 120 and the fine variable delay line 130 is indicated on a vertical axis 1010. A voltage Vccdllm coupled to the delay elements in the coarse variable delay line 120 and the fine variable delay line 130 is indicated on a horizontal axis 1020. First and second threshold voltages Vth0 and Vth1 indicate voltage threshold borders between three regions in the plot 1000. Where Vccdllm is higher than Vth0, a decrease in Vccdllm will result in a relatively small increase in the delay imparted to the reference signal REF according to the lower slope of a dashed line 1042. Where Vccdllm is between Vth0 and Vth1, a decrease in Vccdllm will result in a medium increase in the delay imparted to the reference signal REF according to the medium slope of a dashed line 1044. Where Vccdllm is lower than Vth1, a decrease in Vccdllm will result in a relatively large increase in the delay imparted to the reference signal REF according to the higher slope of a dashed line 1046. The solid line 1048 indicates a simulation of the predicted delay imparted to the reference signal REF in response to changes in Vccdllm. A location 1060 indicates where the DLL 100 operates without any modulation. A voltage Vm0 indicates where the DLL 100 operates after a first modulation of Vccdllm. A voltage Vm1 indicates where the DLL 100 operates after a second modulation of Vccdllm. The delay to the reference signal REF increases as Vccdllm decreases. The DLL 100 may not lock after both of the modulations at Vm0 and Vm1, and the effect of more modulations of Vccdllm are shown in FIG. 11.

Figure 11:
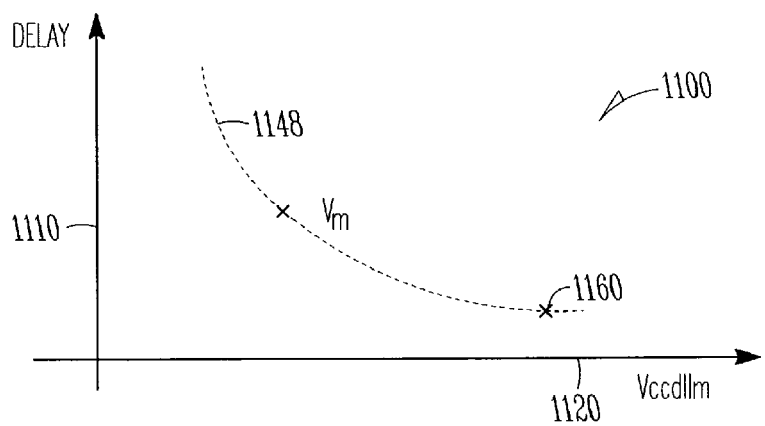
FIG. 11 is a plot of a simulation of a delay imparted to a reference signal by a DLL in response to power supplied to delay elements in the DLL according to an embodiment of the invention.

FIG. 11 is a plot 1100 of a simulation of a delay imparted to the reference signal REF by the DLL 100 in response to the power supplied to the delay elements in the DLL 100 according to an embodiment of the invention. A delay imparted by the combination of the coarse variable delay line 120 and the fine variable delay line 130 is indicated on a vertical axis 1110. A voltage Vccdllm coupled to the delay elements in the coarse variable delay line 120 and the fine variable delay line 130 is indicated on a horizontal axis 1120. A dashed line 1148 indicates a simulation of the predicted delay imparted to the reference signal REF in response to repeated changes in Vccdllm of by increments. The increments may be the same, or may change based on the slope of the line 1148. The steeper the slope of the line 1148, the greater the change in the imparted delay from a given increment of Vccdllm. A location 1160 indicates where the DLL 100 operates without any modulation, and the delay to the reference signal REF increases as Vccdllm decreases. The increased number of possible modulations of Vccdllm shown in FIG. 11 result in improved chances for putting the DLL 100 in a locking state.

Figure 12:
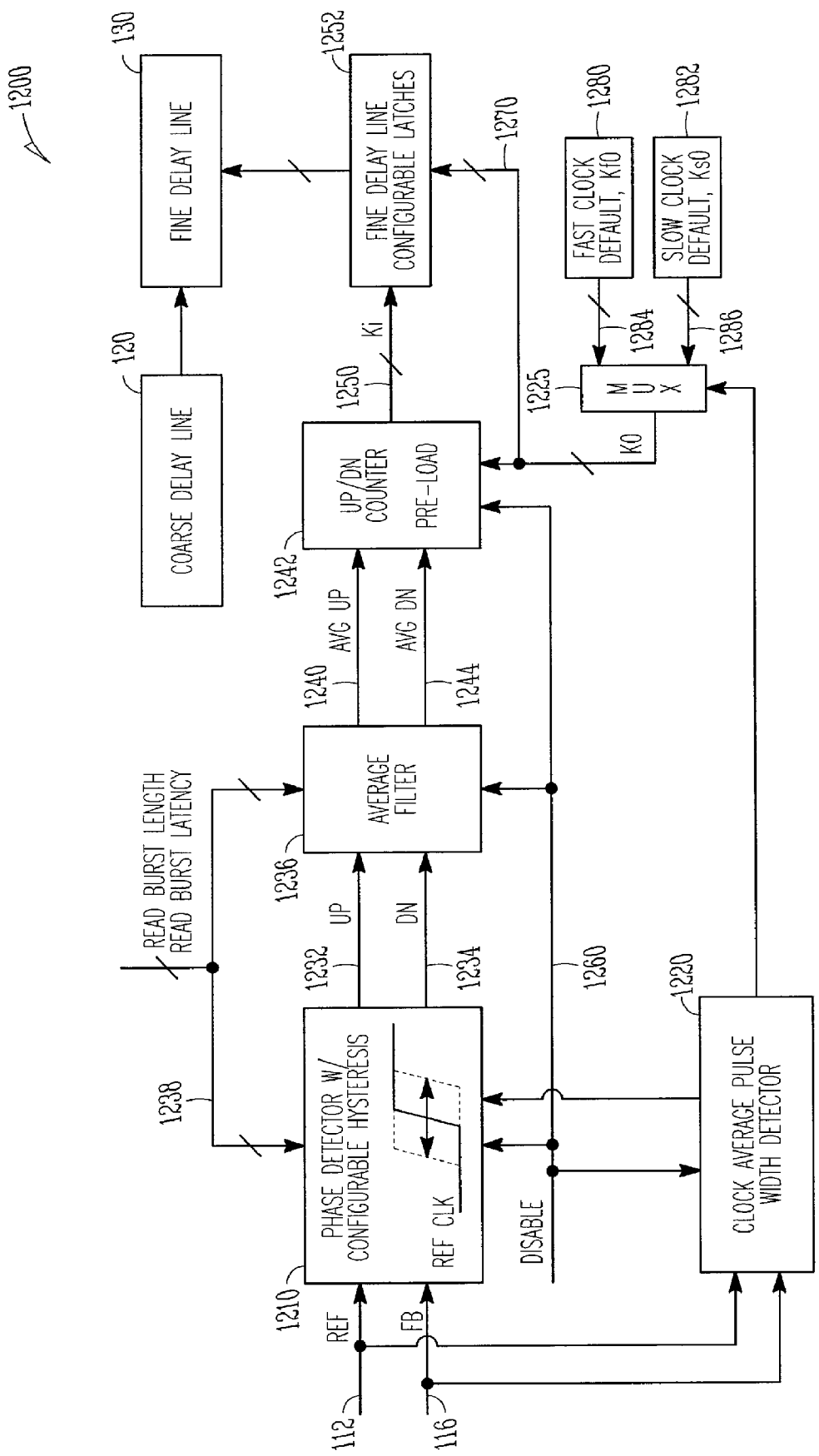
FIG. 12 is a block diagram of a coarse/fine ratio control circuit according to an embodiment of the invention.

FIG. 12 is a block diagram of a coarse/fine ratio control circuit 1200 according to an embodiment of the invention. The circuit 1200 is an example of the coarse/fine ratio control circuit 170 shown in FIG. 1. A phase detector 1210 and a clock average pulse width detector 1220 are both coupled to receive the periodic reference signal REF from the line 112 and the feedback signal FB from the line 116 that were described above with reference to the DLL 100 shown in FIG. 1. The clock average pulse width detector 1220 determines an average pulse width of the periodic reference signal REF on the line 112 and couples that information to the phase detector 1210 and to a multiplexer 1225. The circuit 1200 adjusts a delay caused by each delay element in the fine variable delay line 130 based on the average pulse width or frequency of the periodic reference signal REF on the line 112. As a result, the circuit 1200 adjusts a ratio of the delay imparted by a delay element in the coarse variable delay line 120 to a delay imparted by a delay element in the fine variable delay line 130.

The phase detector 1210 includes a configurable hysteresis loop to compare a phase difference between the periodic reference signal REF on the line 112 and the feedback signal FB line 116. The hysteresis loop has an upper limit that is separated from a midpoint (indicating a zero phase difference) by a quantity that is larger than a delay imparted by one delay element in the fine variable delay line 130. Similarly, the hysteresis loop has a lower limit that is separated from the midpoint by a quantity that is larger than the delay imparted by a delay element in the fine variable delay line 130. A distance between the upper limit and the lower limit of the hysteresis loop is approximately larger than two times the delay imparted by the delay element in the fine variable delay line 130. The phase difference between the periodic reference signal REF on the line 112 and the feedback signal FB on the line 116 is compared to the hysteresis loop.

If the phase difference between the periodic reference signal REF on the line 112 and the feedback signal FB line 116 is greater than the upper limit of the hysteresis loop, the phase detector 1210 generates an up count on a line 1232 that is coupled to an average filter 1236. Similarly, if the phase difference between the periodic reference signal REF on the line 112 and the feedback signal FB line 116 is less then the lower limit of the hysteresis loop, the phase detector 1210 generates a down signal on a line 1234 that is coupled to the average filter 1236. If the phase difference is sufficient, the phase detector 1210 generates an up signal or a down signal on the lines 1232, 1234 for each period of the periodic reference signal REF on the line 112. The average filter 1236 averages the up and down signals from the phase detector 1210.

The average filter 1236 and the phase detector 1210 receive a read burst latency value and a read burst length value from multiple lines 1238. The read burst latency and read burst length values come from a mode register in a control logic circuit of a memory device (not shown) and indicate when to expect read data output and a number of bits to be read for each read command issued to the memory device. The average filter 1236 averages the up signals from the line 1232 and the down signals from the line 1234 with reference to the read burst length. If the average filter 1236 receives a number of up signals on the line 1232 equal to the read burst length or a predefined value, such as a portion of the read burst length, the average filter 1236 generates an average up signal on a line 1240 that is coupled to an up down counter 1242. The read burst length or the predefined value determine a timing tolerance for this event. Similarly, if the average filter 1236 receives a number of down signals from a line 1234 that equals the read burst length or the predefined value, the average filter 1236 generates an average down signal on a line 1244 that is coupled to the up down counter 1242. As will be described more fully below, the average filter 1236 directs a change in the fine variable delay line 130 only when the phase detector 1210 detects a phase difference that is outside the hysteresis loop for multiple periods of the periodic reference signal REF on the line 112.

The up down counter 1242 generates a binary number Ki on a set of parallel lines 1250 that is coupled to fine delay line configurable latches 1252. The number Ki includes a predetermined number of binary digits, including zeros and/or ones, and is increased by one each time an average up signal is received from the line 1240. Ki is likewise reduced by one each time an average down signal is received from the line 1244.

The number Ki in the fine delay line configurable latches 1252 controls triad enabled inverters for each delay element in the fine variable delay line 130. Each delay element in the fine variable delay line 130 is driven by a number of triad enabled inverters, and the more inverters that are enabled for a delay element, the less delay the delay element imparts to a signal. Conversely, reducing the number of enabled inverters in a delay element increases the delay imparted by the delay element in the fine variable delay line 130. The number Ki therefore controls the delay imparted by each delay element in the fine variable delay line 130 by determining the number of inverters that are active in each delay element.

The circuit 1200 operates as described unless a disable signal on a line 1260 is activated to disable the phase detector 1210, the clock average pulse width detector 1220, the average filter 1236, and the up down counter 1242. These circuits may be disabled in order to stop changes in the delay imparted by each delay element in the fine variable delay line 130, or to simply save power. If the disable line 1260 is active, the fine delay line configurable latches 1252 receive a binary number K0 from a set of parallel lines 1270 to set the delay imparted by each delay element in the fine variable delay line 130. The number K0 is also coupled to the up down counter 1242. The number K0 is generated by the multiplexer 1225 based on two default numbers, a fast clock default number Kf0 in a first register 1280 and slow clock default number Ks0 in a second register 1282. The number Kf0 is coupled to the multiplexer 1225 over a set of parallel lines 1284, and the number Ks0 is coupled to the multiplexer 1225 over a set of parallel lines 1286. The multiplexer 1225 chooses as the number K0 either Kf0 or Ks0 based on the average pulse width of the periodic reference signal REF on the line 112.

Figure 13:
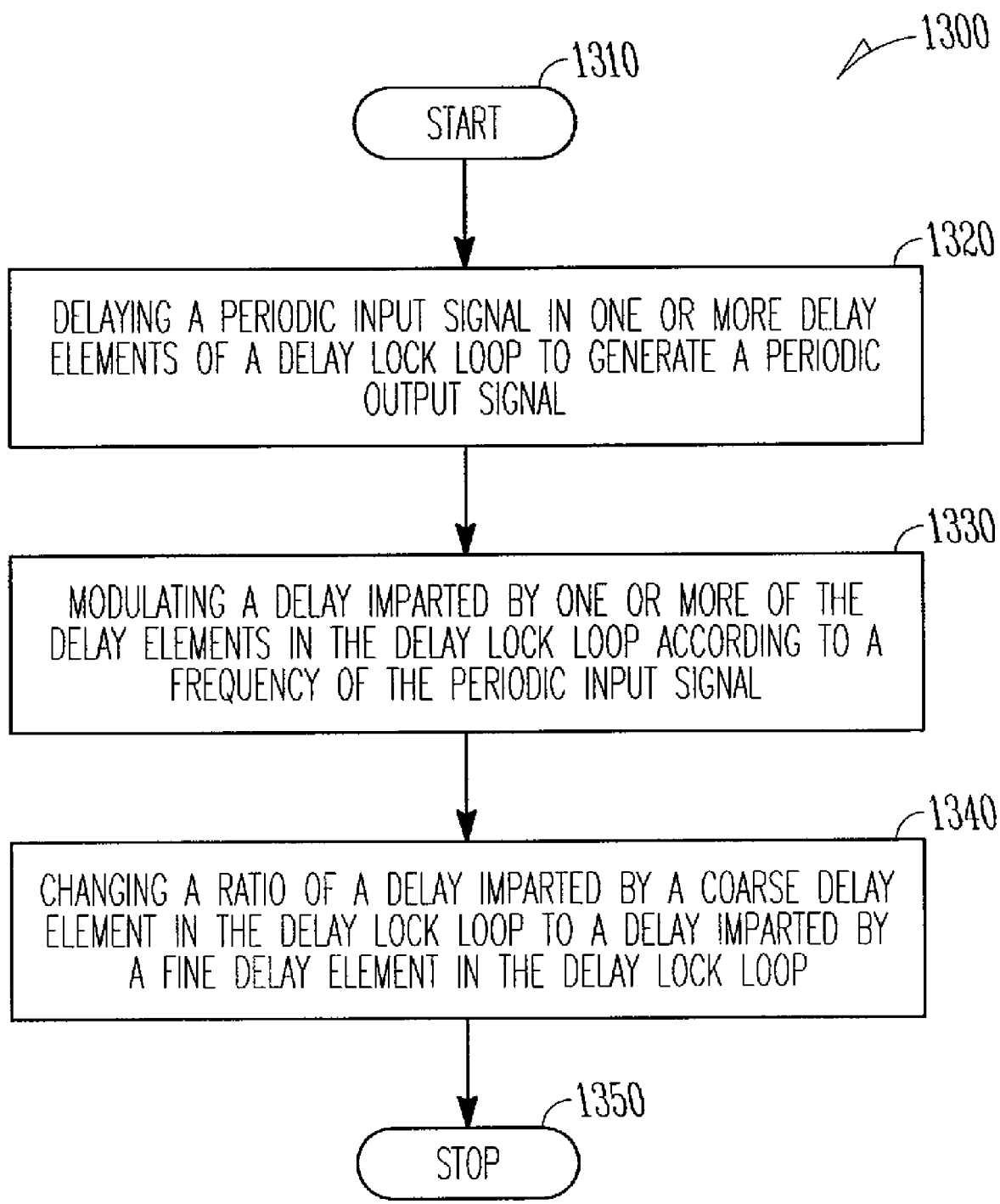
FIG. 13 is a flow diagram of several methods associated with the operation of the DLL in FIG. 1 according to an embodiment of the invention.

FIG. 13 is a flow diagram of several methods 1300 associated with the operation of the DLL 100 in FIG. 1 according to embodiments of the invention. The methods 1300 start in block 1310. In block 1320, a periodic input signal such as the reference signal REF is delayed in one or more delay elements of the DLL 100 to generate the periodic output signal OUT. In block 1330, a delay imparted by one or more of the delay elements in the DLL 100 is modulated according to a frequency of the periodic input signal. In block 1340, a ratio of a delay imparted by a coarse delay element in the DLL 100 to a delay imparted by a fine delay element in the DLL 100 is changed. In block 1350, the methods 1300 end.

Figure 14:
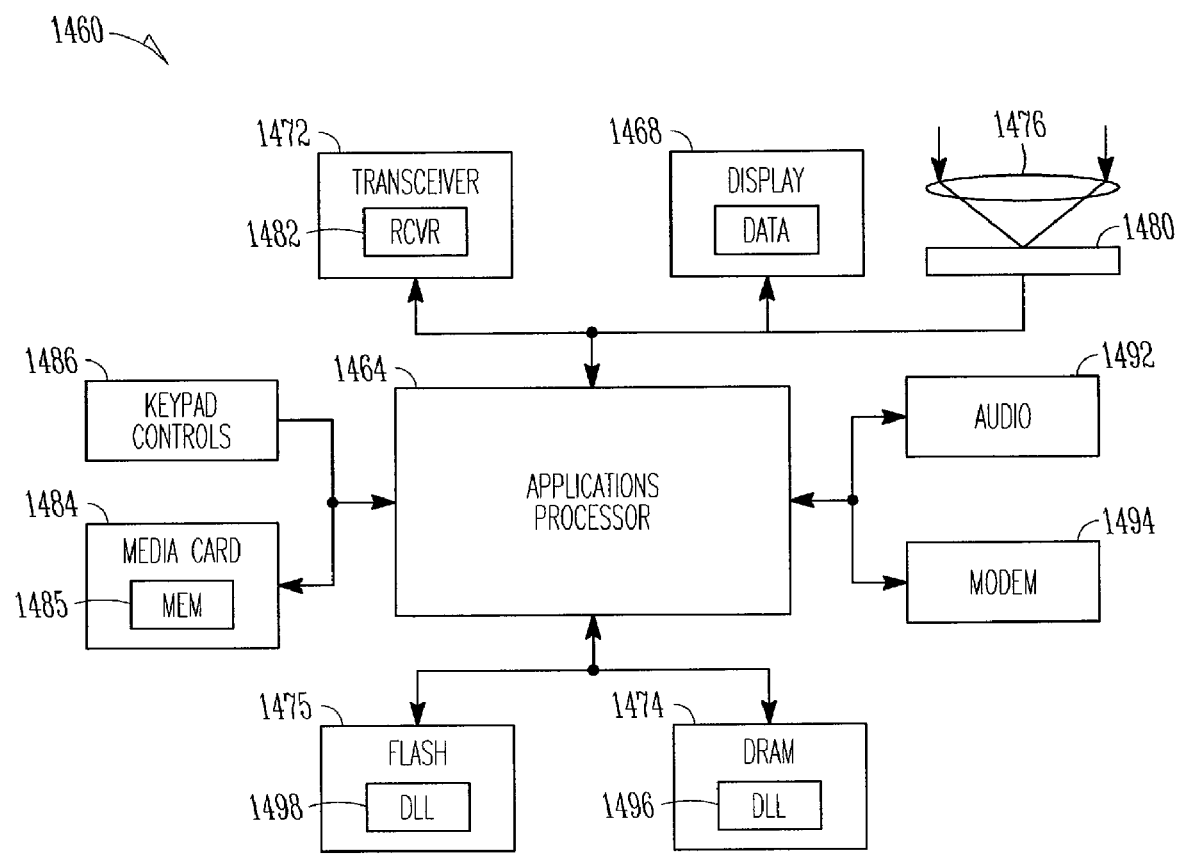
FIG. 14 is a block diagram of a system according to an embodiment of the invention.

FIG. 14 is a block diagram of a system 1460 according to an embodiment of the invention. The system 1460, in some embodiments, may include a processor 1464 coupled to a display 1468 and/or a wireless transceiver 1472. The display 1468 may be used to display data, perhaps received by the wireless transceiver 1472. The system 1460, in some embodiments, may include a memory device such as a dynamic random access memory (DRAM) 1474 and/or a Flash memory 1475. The processor 1464 is coupled to exchange data with the DRAM 1474 and the Flash memory 1475. The DRAM 1474 may be a synchronous DRAM (SDRAM).

In some embodiments, the system 1460 may include a camera including a lens 1476 and an imaging plane 1480 to couple to the processor 1464. The imaging plane 1480 may be used to receive light captured by the lens 1476.

Many variations are possible. For example, in some embodiments, the system 1460 may include a cellular telephone receiver 1482 forming a portion of the wireless transceiver 1472. The cellular telephone receiver 1482 may also receive data to be processed by the processor 1464, and displayed on the display 1468. In some embodiments, the system 1460 may include an audio, video, or multi-media player 1484, including a memory device 1485 and a set of media playback controls 1486 to couple to the processor 1464. The processor 1464 may also be coupled to exchange data with an audio device 1492 and/or a modem 1494.

The DRAM 1474 includes a DLL 1496 and the Flash memory 1475 includes a DLL 1498 to generate periodic signals such as clock signals according to embodiments of the invention described herein. One or more of the other devices in the system such as the processor 1464, the multi-media player 1484, the memory device 1485, the media playback controls 1486, the display 1468, the wireless transceiver 1472, the receiver 1482, the audio device 1492, and the modem 1494, may include a DLL to generate a periodic signal such as a clock signal according to embodiments of the invention described herein.

Any of the circuits or systems described herein may be referred to as a module. A module may comprise a circuit and/or firmware according to embodiments of the invention.

The individual activities of methods 700, 800, and 1300 may be performed in the order shown, or in another order. Some activities may be repeated, and others may occur only once. Embodiments of the invention may have more or fewer activities than those shown in FIGS. 7, 8, and 13.

Implementation of the embodiments of the invention described herein can accommodate for longer clock signal periods by modulating power supplied to the delay elements in the DLL 100. As the power supplied to the delay elements is reduced, the delay imparted by each delay element increases to allow the DLL 100 to lock a received signal with a longer period without using all of its delay elements. Implementation of the embodiments of the invention described herein can also change the coarse/fine ratio by modulating the delay imparted by delay elements in the fine delay line 130 according to a frequency of the input signal. This is done to maintain the output signal OUT of the DLL 100 in within a specification requirement.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Examples merely typify possible variations. Portions and features of some embodiments may be included in, or substituted for, those of others. Many other embodiments will be apparent to those skilled in the art upon reading and understanding the above description. Therefore, the scope of an embodiment of the invention of the invention is determined by the appended claims, along with the full range of equivalents to which such claims are entitled.

The Abstract is provided to comply with 37 C.F.R. §1.72(b) requiring an abstract that will allow the reader to quickly ascertain the nature of the technical disclosure. The Abstract is submitted with the understanding that it will not be used to interpret or limit the scope or meaning of the claims.

What is claimed is:

1. A method comprising:
   delaying a periodic input signal in one or more delay elements of a group of delay elements of a lock loop circuit to generate a periodic output signal; and
   modulating a power supply to the delay elements using a power supply modulator of the lock loop circuit to vary the delay to the periodic input signal imparted by each delay element upon determination that a predetermined number of the delay elements are used for the delaying the periodic input signal, the predetermined number of the delay elements used for the delaying the periodic input signal indicating that the lock loop circuit is not in lock.

2. The method of claim 1, wherein the modulating the power supply to the delay elements further includes:
   decreasing the power supply to the delay elements by a first increment; and
   determining if the predetermined number of the delay elements are delaying the periodic input signal to generate the periodic output signal.

3. The method of claim 2, wherein the modulating the power supply to the delay elements further includes:
   decreasing the power supply to the delay elements by a second increment in addition to the first increment; and
   determining if the predetermined number of the delay elements are used for the delaying the periodic input signal to generate the periodic output signal.

4. The method of claim 1, wherein the modulating the power supply to the delay elements further includes:
   decreasing the power supply to the delay elements by one or more increments;
   determining if the predetermined number of the delay elements are used for the delaying the input signal to generate the periodic output signal after each change in the power supply; and
   maintaining the power supply to the delay elements if one or more of the delay elements are not imparting a delay to the periodic input signal to generate the periodic output signal or if the power supply is below a minimum power supply.

5. The method of claim 1, wherein the power supply to the delay elements comprises a supply voltage coupled to the delay elements.

6. The method of claim 1, wherein the periodic output signal comprises a periodic output clock signal.

7. The method of claim 1, wherein the delaying the periodic input signal in one or more delay elements further comprises:
   comparing a phase of the periodic output signal with a phase of the periodic input signal to determine a phase difference between the periodic output signal and the periodic input signal; and
   coupling the periodic input signal to a variable delay line including the delay elements at a delay element selected according to the phase difference to delay the periodic input signal to generate the periodic output signal.

8. The method of claim 1, wherein the lock loop circuit comprises a delay lock loop DLL circuit.

9. The method of claim 8, wherein the predetermined number indicates that only three or less of the delay elements are not imparting a delay to the periodic input signal to generate the periodic output signal.

10. The method of claim 1, wherein the delay imparted by one or more of the delay elements in the group of delay elements to the periodic input signal is modulated while the periodic input signal is being delayed.

11. The method of claim 1, wherein the delay imparted by one or more of the delay elements in the group of delay elements to the periodic input signal is modulated according to a frequency of the periodic input signal.

12. The method of claim 1, wherein the delay elements include coarse delay elements and fine delay elements, further comprising changing a ratio of a delay imparted by one of the coarse delay elements to a delay imparted by one of the fine delay elements using a ratio controller coupled to the fine delay elements.

13. The method of claim 1, further comprising determining a number of modulation attempts before modulating the power supply and refraining from modulating the power supply upon determination that the number of modulation attempts reaches a specified number.

14. An apparatus comprising:
   a plurality of delay elements configured to delay a periodic input signal to generate a periodic output signal; and
   a first module coupled to the plurality of delay elements and configured to modulate power supplied to the delay elements to change the delay to the periodic input signal generated by each delay element in the plurality upon determination that the periodic input signal is delayed by a predetermined number of the delay elements, the predetermined number of the delay elements used to delay the periodic input signal indicating that the apparatus is not in lock.

15. The apparatus of claim 14, wherein the delay elements include coarse delay elements and fine delay elements, further comprising a second module coupled to the plurality of delay elements, the second module configured to change a ratio of a delay imparted by a coarse delay element to a delay imparted by a fine delay element.

16. The apparatus of claim 14, wherein the delay elements include coarse delay elements and fine delay elements, further comprising a shift register configured to select one of the coarse elements as an entry point for the periodic input signal into the delay elements.

17. The apparatus of claim 14, wherein the delay elements include one or more digital gates or analog circuits that are connected serially.

18. The apparatus of claim 14, wherein the first module coupled is configured to modulate the delay imparted by one or more of the delay elements to the periodic input signal while the periodic input signal is being delayed.

19. The apparatus of claim 14, wherein the delay elements include a plurality of coarse delay elements and a plurality of fine delay elements, the first module coupled to the fine delay elements and configured to modulate a delay imparted by each of the fine delay elements.

20. The apparatus of claim 14, wherein the apparatus comprises a delay lock loop (DLL) circuit.

21. The apparatus of claim 14, further comprising a second module coupled to the first module, the second module configured to determine a number of modulation attempts before the power supply is modulated and inhibit the power supply from being modulated upon determination that the number of modulation attempts reaches a specified number.

22. A system comprising:
   a processor; and
   a memory device operatively coupled to the processor, the memory device including a lock loop circuit, the lock loop circuit comprising:
   a plurality of delay elements configured to delay a periodic input signal to generate a periodic output signal; and a first module coupled to the plurality of delay elements and configured to modulate power supplied to the delay elements to change the delay to the periodic input signal generated by each delay element in the plurality upon determination that the periodic input signal is delayed by a predetermined number of the delay elements, the predetermined number of the delay elements used to delay the periodic input signal indicating that the lock loop circuit is not in lock.

23. The system of claim 22, wherein the delay elements include coarse delay elements and fine delay elements, further comprising a second module coupled to the plurality of delay elements and configured to change a ratio of a delay imparted by one of the coarse delay elements to a delay imparted by one of the fine delay elements.

24. The system of claim 22, further comprising a component selected from the group consisting of one or more of a lens and an imaging plane to couple to the processor, the imaging plane being configured to receive light captured by the lens, a set of media playback controls to couple to the processor, and a display to couple to the processor and configured to display data, in any combination.

25. The system of claim 22, further comprising a cellular telephone receiver configured to receive data, the cellular telephone receiver forming a portion of a wireless transceiver coupled to the processor.

26. The system of claim 22, wherein the lock loop circuit comprises a delay lock loop (DLL) circuit.

27. The system of claim 22, wherein the lock loop circuit comprises a second module coupled to the first module, the second module configured to determine a number of modulation attempts before the power supply is modulated and inhibit the power supply from being modulated upon determination that the number of modulation attempts reaches a specified number.

* * * * *

UNITED STATES PATENT AND TRADEMARK OFFICE
CERTIFICATE OF CORRECTION

PATENT NO.        : 7,737,741 B2                                         Page 1 of 1
APPLICATION NO.   : 11/858727
DATED             : June 15, 2010
INVENTOR(S)       : Yantao Ma It is certified that error appears in the above-identified patent and that said Letters Patent is hereby corrected as shown below:

In column 13, line 61, in Claim 8, delete "DLL" and insert -- (DLL) --, therefor.

Signed and Sealed this

Seventeenth Day of August, 2010

David J. Kappos
*Director of the United States Patent and Trademark Office*